United States Patent [19]
Moslehi

[11] Patent Number: 5,321,298
[45] Date of Patent: Jun. 14, 1994

[54] SOI WAFER FABRICATION BY SELECTIVE EPITAXIAL GROWTH

[75] Inventor: Mehrdad M. Moslehi, Dallas, Tex.

[73] Assignee: Texas Instruments Incorporated, Dallas, Tex.

[21] Appl. No.: 113,884

[22] Filed: Aug. 30, 1993

Related U.S. Application Data

[60] Continuation of Ser. No. 928,830, Aug. 11, 1992, abandoned, which is a division of Ser. No. 619,785, Nov. 29, 1990, Pat. No. 5,143,862.

[51] Int. Cl.$^5$ .............................................. H01L 27/12
[52] U.S. Cl. ........................................ 257/506; 257/513
[58] Field of Search ............... 257/506, 510, 513, 520, 257/524

[56] References Cited

U.S. PATENT DOCUMENTS 4,501,060  2/1985  Frye et al. .......................... 257/506

*Primary Examiner*—Gene M. Munson
*Attorney, Agent, or Firm*—Dana L. Burton; Richard A. Stoltz; James C. Kesterson

[57] ABSTRACT

This is a method of forming a semiconductor-on-insulator water with a single-crystal semiconductor substrate. Preferably the method comprises: anisotropically etching a substrate 22 to form trenches 24 having walls and bottoms; anisotropically depositing oxide 26,28,34 over a surface of the substrate 22 and on the trench 24 walls and bottoms; etching to remove trench wall oxide 28, but leaving oxide 26,34 over the semiconductor surface 22 and on the trench 24 bottom, thereby creating seed holes which expose portions of the semiconductor substrate 22; epitaxially growing semiconductor material 32 on the exposed portions of the semiconductor substrate 22 to partially fill the trenches; depositing nitride; anisotropically etching the nitride to form nitride sidewalls 36; forming oxide 40 on top of the grown semiconductor material; removing nitride sidewalls 36; anisotropically etching semiconductor 42 until the buried oxide 34 is reached, thereby leaving islands of semiconductor material 44 on the buried oxide layer 34; thermally growing oxide 46 on areas of exposed semiconductor; anisotropically etching oxide 40 to expose the top of the semiconductor islands 44; and epitaxially growing semiconductor material 48 to merge the semiconductor islands 44 and create a layer of single-crystal semiconductor material which is insulated from the substrate 22. This is also a semiconductor-on-insulator wafer structure. The wafer comprises: trenches 24 having walls and bottoms in a single-crystal semiconductor substrate (e.g. silicon substrate 22); a first insulator (e.g. oxide 20,26,34) on a surface of the substrate and on the trench bottoms; a second insulator (e.g. oxide 46) on the trench walls; and a layer of single-crystal semiconductor material (e.g. silicon epi layer 48) on the surface and extending into the trenches, with the layer being insulated from the substrate.

5 Claims, 4 Drawing Sheets

SOI WAFER FABRICATION BY SELECTIVE EPITAXIAL GROWTH

This application is a continuation of application Ser. No. 07/928,830, filed Aug. 11, 1992, now abandoned, which is a division of Ser. No. 07/619,785, filed Nov. 29, 1990, U.S. Pat. No. 5,143,862.

NOTICE.

(C) Copyright, *M* Texas Instruments Incorporated 1990. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to semiconductor fabrication methods and devices, and more specifically to semiconductor on insulator (SOI) fabrication methods and devices.

BACKGROUND OF THE INVENTION

SOI technologies have been investigated extensively for a number of applications including radiation resistant or rad-hard devices, high-performance high-speed IC's, and 3-D integrated devices. Various techniques have been investigated for SOI material formation. These include:
1. Silicon-on-Sapphire (by epitaxial growth)
2. Silicon-on-CaF2 or BaF2 (by MBE)
3. SOI by selective epitaxial lateral overgrowth (ELO-SEG)
4. SIMOX (high-energy oxygen implantation into Si)
5. SOI by wafer bonding
6. Recrystallization techniques Among those techniques, SOS, SIMOX, and SOI by wafer bonding are the most manufacturable techniques at present. In general, the SIMOX approach requires high-dose, high-energy O+ ion implantation. The optimization of the SIMOX material quality requires special attention to the implantation and subsequent annealing conditions. The single crystal silicon layer formed on the SIMOX wafer is rather than (e.g. less than a few thousand Å). In some cases, it may be necessary to deposit a layer of epitaxial silicon on top of the SIMOX material in order to reduce the number of defects in the active device regions and fabricate devices away from the defective silicon/silicon dioxide interface.

The wafer bonding techniques employ various bonding methods such as annealing, mechanical pressing and annealing, or electric-field pressing and annealing. Various interlayer insulators such as thermal silicon dioxide and doped oxide have been used. Typical wafer bonding processes are based on the Van der Walls forces which require extremely flat and defect free surfaces. When the two silicon wafers are bonded together, various methods can be used to thin the wafers to form the SOI layers.

The SOI material fabrication by ELO-SEG (epitaxial lateral overgrowth-selective epitaxial growth) is based on selective epitaxial filling of seed holes and lateral epitaxial overgrowth followed by a subsequent etch back to produce thin epi on patterned oxide. The original oxide layer is patterned in order to provide silicon seed holes for SEG and subsequent lateral overgrowth. There is a trade-off between the epi material quality (and manufacturing cost) and the amount of electrical isolation between epi and semiconductor substrate.

SUMMARY OF THE INVENTION

This is a method of forming a semiconductor-on-insulator wafer with a single-crystal semiconductor substrate. Preferably the method comprises: anisotropically etching a substrate to form trenches having walls and bottoms; anisotropically depositing oxide over a surface of the substrate and on the trench walls and bottoms; selective etching to remove trench wall oxide, but leaving oxide over the semiconductor surface and on the trench bottom, thereby creating sidewall seed holes which expose portions of the semiconductor substrate; epitaxially growing semiconductor material on the exposed portions of the semiconductor substrate to partially fill the trenches; depositing nitride; anisotropically etching the nitride to form nitride sidewalls; growing (e.g. thermally forming) oxide on top of the grown semiconductor material; selectively removing nitride sidewalls; anisotropically etching exposed semiconductor until the buried oxide is reached, thereby leaving islands of selectively grown semiconductor material on the buried oxide layer; thermally growing oxide on areas of exposed semiconductor; anisotropically etching oxide to expose the top of the semiconductor islands; and epitaxially growing semiconductor material to merge the semiconductor islands and create a layer of single-crystal semiconductor material which is electrically insulated from the substrate.

More generally, the method comprises: anisotropically etching a surface of the substrate to form trenches having sidewalls and bottoms; anisotropically depositing a first insulator over the substrate surface and on the trench walls and bottoms; etching to remove first insulator from the trench walls, but leaving first insulator over the semiconductor substrate surface and on the trench bottoms, thereby creating seed holes which expose portions of the semiconductor substrate; epitaxially growing semiconductor material on the exposed portions of the semiconductor substrate to partially fill the trenches; depositing sidewall forming material, the sidewall forming material being different from the first insulator; anisotropically etching the sidewall forming material to form sidewalls and to bare surfaces of the epitaxially grown semiconductor material; forming an etch mask material on the bare semiconductor material; removing the sidewalls and uncovering areas of semiconductor material; anisotropically etching the uncovered areas of semiconductor material until the first insulator on the trench bottom is reached, thereby leaving islands of semiconductor material on the first insulator on the trench bottoms and leaving exposed walls of semiconductor material on the islands and on the substrate; forming a second insulator on exposed walls of semiconductor material; removing the etch mask material; and epitaxially growing semiconductor material to merge the semiconductor islands and create a layer of single-crystal semiconductor material which is essentially completely insulated from the substrate.

Preferably the first insulator and the second insulator are of the same material (most preferably oxide), the sidewall forming material is nitride, the growable etch mask is oxide, and the semiconductor is silicon.

This is also a semiconductor-on-insulator wafer structure. The wafer comprises: trenches having walls and bottoms in a single-crystal semiconductor (e.g. silicon) substrate; a first insulator (e.g. oxide) on a surface of the substrate and on the trench bottoms; a second insulator (e.g. oxide) on the trench walls; and a layer of single-crystal semiconductor material (e.g. silicon) on the surface and extending into the trenches, with the layer being electrically insulated from the substrate.

DETAILED DESCRIPTION OF PREFERRED EMBODIMENTS

Figure 1:
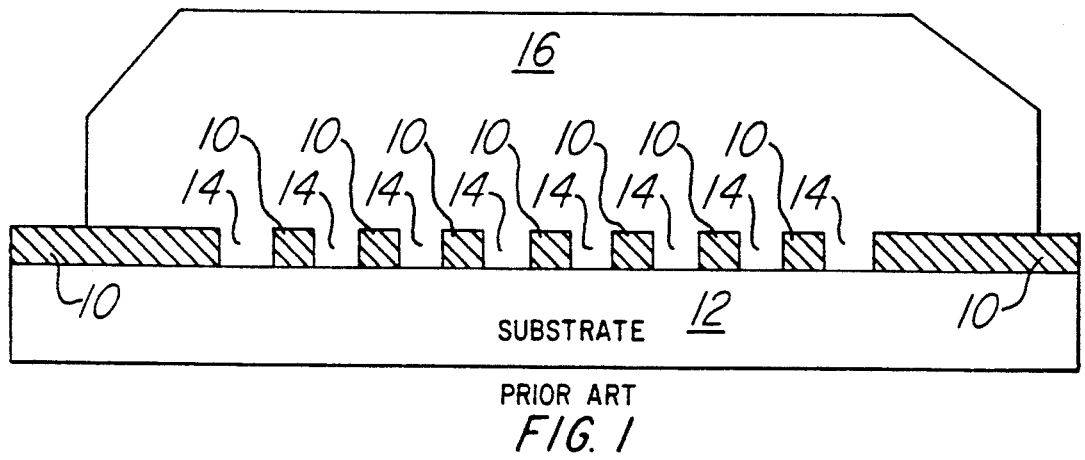
FIG. 1 is a cross-sectional view of a prior art SOI wafer formed by an SEG-ELO process.

FIG. 1 shows an example of a prior art semiconductor-on-insulator (SOI) wafer formed by a selective epitaxial growth - epitaxial lateral overgrowth (SEG-ELO) process. The wafer is made by first growing, or depositing, a layer of oxide 10 over a silicon substrate 12 followed by pattern formation and etching of seed holes 14 (exposed silicon areas) through the oxide layer 10. Silicon is then epitaxially and selectively grown in these seed holes 14. The epitaxial (epi) islands, grown in the seed holes 14, may then be merged by lateral overgrowth and an etch back performed to thin the epi layer 16 to the desired thickness. In the conventional method of SEG-ELO, the number of seed holes 14 should be sufficiently large in order to allow for merging of the adjacent epitaxial islands, grown in the seed holes 14, in a reasonable epi process time without any defect formation at the merged interfaces. This condition makes the seed-to-seed spacing less than a few micrometers. However, the seed regions 14 provide an electrical link between the etched back epi layer 16 and silicon substrate 12, resulting in a degradation of epi-to-substrate electrical isolation. The number of seed holes 14 can be reduced, but this will increase the epi growth time in order to allow proper merging of the adjacent islands in the seed holes 14. Moreover, a longer etch back will be required to thin the epi layer 16 to the desired thickness.

Figure 2K:
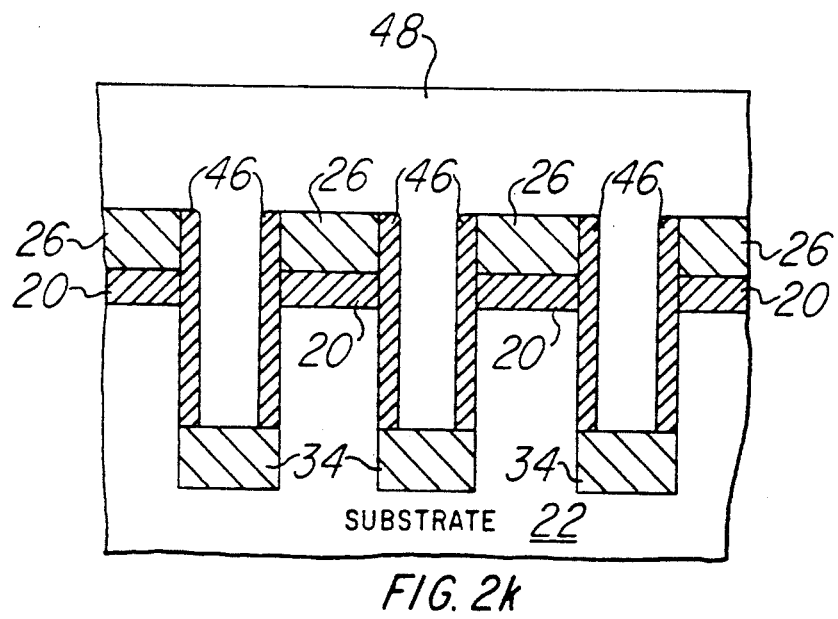
FIGS. 2a–k are cross-sectional views of an SOI wafer during sequential processing steps in which a preferred embodiment of this invention is formed using an SEG-ELO process.
Figure 2A:
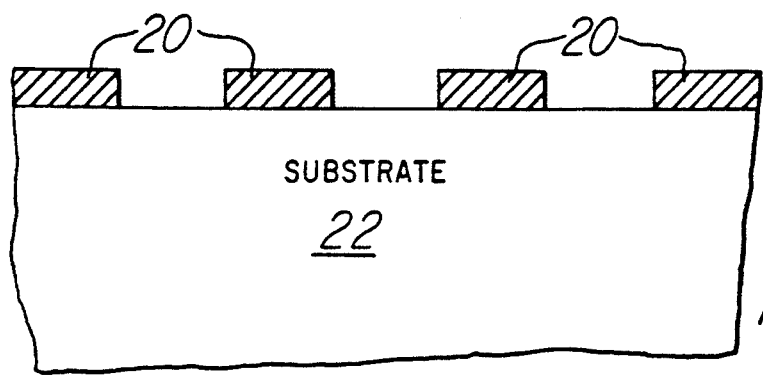
Figure 2B:
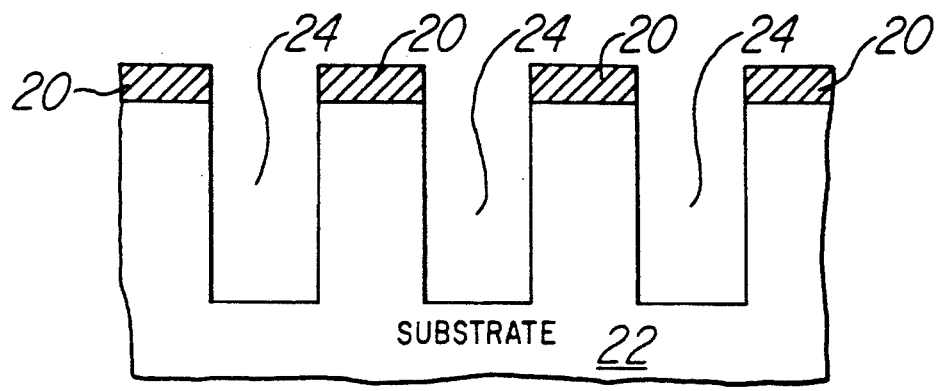

A preferred embodiment of the present invention is shown in FIG. 2k. A method of making this preferred embodiment SOI wafer using an SEG-ELO process will be described with reference to FIGS. 2a–2k. A layer of masking material such as silicon dioxide (oxide) 20, approximately 5000 Å thick, is formed on a silicon substrate 22 then patterned to achieve the structure shown in FIG. 2a. Trenches 24, approximately 2 um high and 1 um wide, are formed, as shown in FIG. 2b, using an anisotropic etch process, such as reactive ion etching (RIE). The trenches 24 may be formed with any appropriate masking step. For example, a photoresist masking process may be used in conjunction with or in place of the oxide 20. At this point, a short thermal oxidation and wet etch may be performed to remove any residual surface damage from the etching process.

Figure 2C:
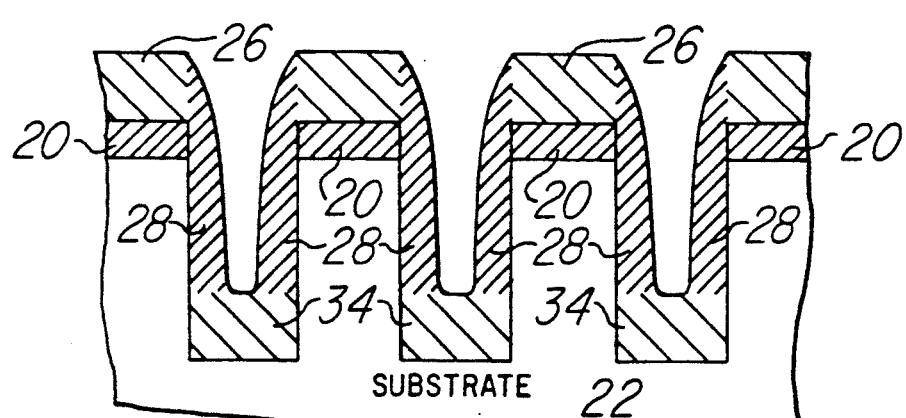
Figure 2D:
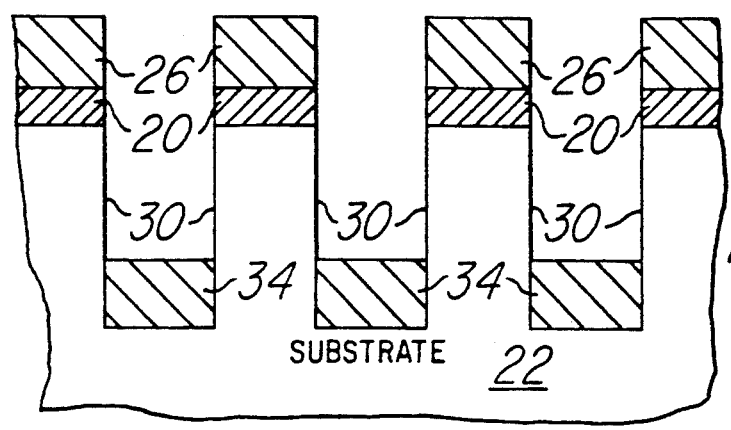

The structure in FIG. 2c is obtained by performing an anisotropic oxide deposition 26,28,34, approximately 1 um thick, using a plasma deposition technique such as electron cyclotron resonance (ECR) or magnetron plasma chemical vapor deposition. A selective such is performed to remove the sidewall oxide 28, exposing substrate sidewalls 30 in the trenches, therefore, creating sidewall seed holes for future SEG-ELO processes, as shown in FIG. 2d. Due to the different characteristics of the anisotropically deposited sidewall oxide 28 compared to the oxide films deposited on flat surfaces 26,34, it is possible to selectively strip the sidewall oxide 28 without removing a significant amount of oxide on the top and bottom surfaces 26,34.

Figure 2E:
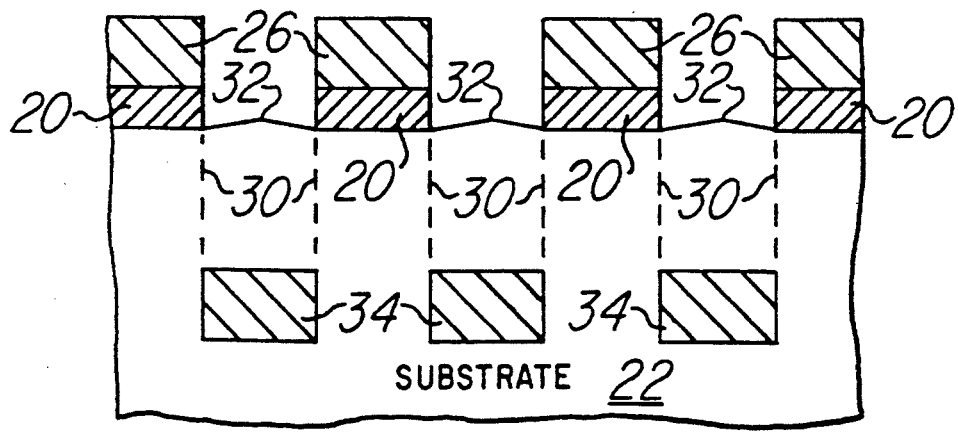
Figure 2F:
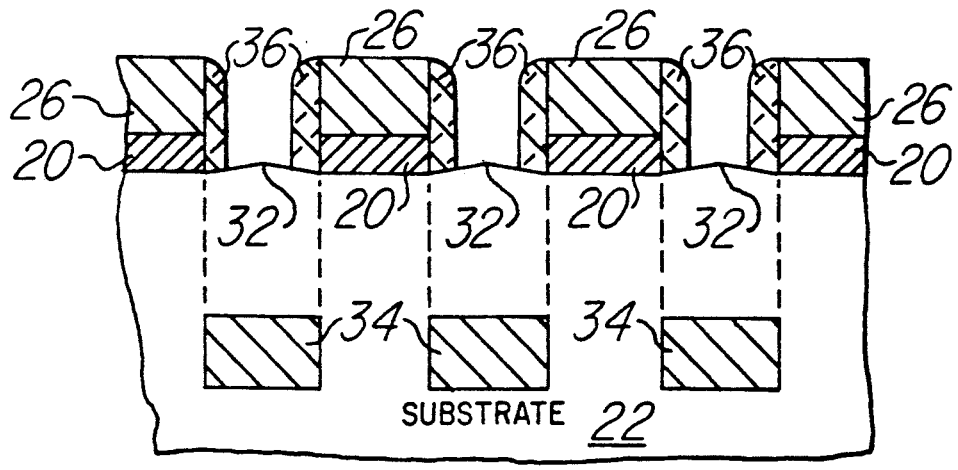
Figure 2G:
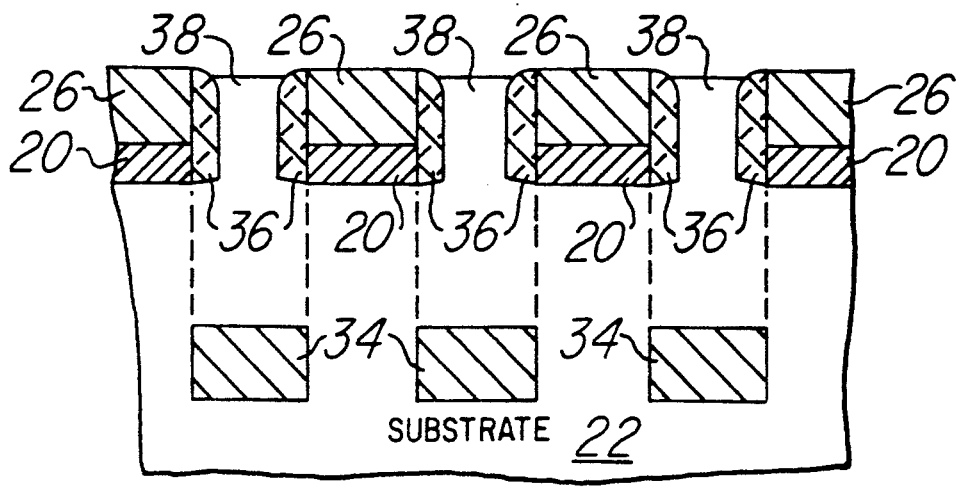

FIG. 2e shows the results of the first SEG process after the trenches are laterally filled preferably to the top of the silicon sidewalls 30, resulting in buried layers of oxide 34 within the silicon substrate 22. The resulting silicon surface 32 may have a small facet angle, resulting in an almost planar surface. An optional oxidation and etch may be done to remove defects before continuing with the next step. A low-pressure chemical vapor deposition (LPCVD) nitride deposition, followed by an anisotropic etching process such as RIE, is performed to form nitride sidewalls 36 on the exposed oxide islands 20,26, resulting in the structure shown in FIG. 2f. Again, an optional oxidation and etch may be performed to remove any surface damage to exposed silicon 32. An optional second SEG process 38 may be performed vertically to completely fill the trenches, as shown in FIG. 2g.

Figure 2H:
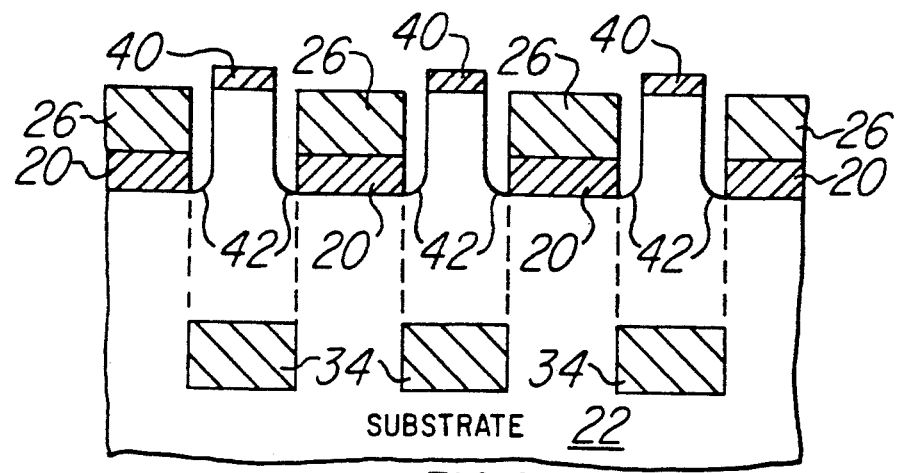
Figure 2I:
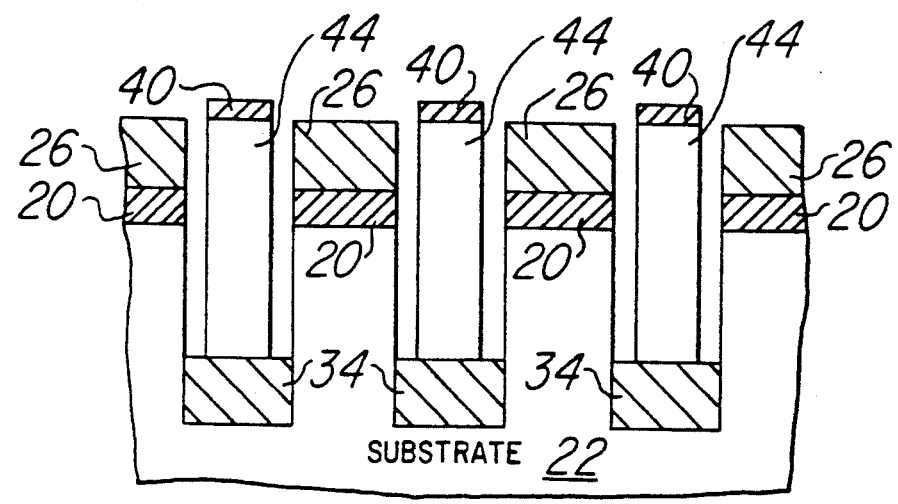
Figure 2J:
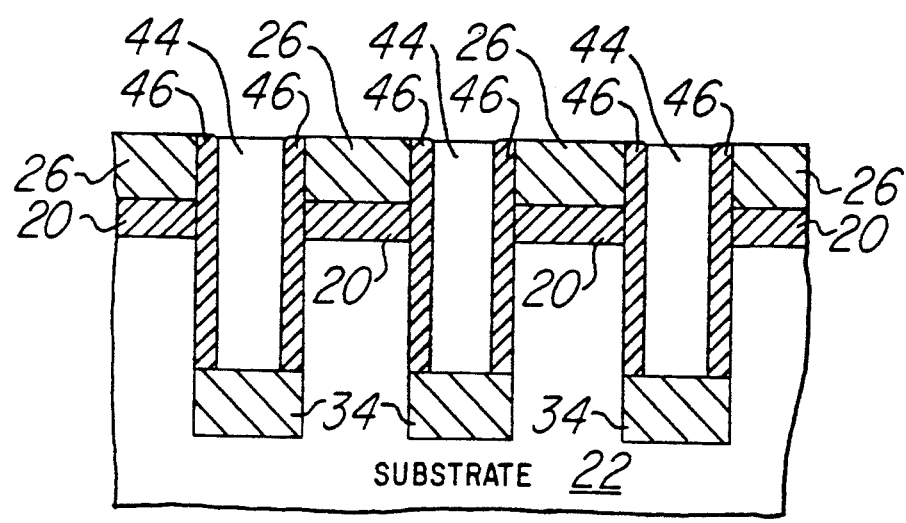

Oxide 40 is formed, approximately 500 Å thick, on top of the exposed silicon 38. The nitride 36 is then selectively stripped using an etchant such as hot phosphoric acid or microwave plasma. The resultant structure is shown in FIG. 2h. An anisotropic etch process, such as RIE, is performed on the exposed silicon 42 until the buried oxide 34 is reached, leaving islands of silicon 44 on the buried oxide layers 34, as shown in FIG. 2i. An optional oxidation and etch may be done to remove any surface damage. The areas to the sides of the silicon islands 44 are filled with oxide 46 by first performing a short thermal oxidation followed by a conformal oxide deposition (e.g. TEOS). The oxide 44 is etched back to expose to top of the silicon islands 44, achieving the structure shown in FIG. 4j. Finally, an SEG-ELO process is done to merge the individual silicon islands 44. The epi layer 48 may then be etched back if a thinner layer is desired. The resultant structure is a fully isolated SOI based on SEG-ELO, as shown in FIG. 2k.

The number of seed holes, using the previously described process, may be determined by the number needed to reduce fabrication cost, to improve material quality, and reduce the need for large epi thinning, without degrading the epi-to-substrate isolation. The suggested process seals all the seed holes with insulators resulting in an epitaxial layer on top of wafer which is completely insulated from the substrate. As a result, the usual trade-off between epi substrate isolation and fabrication cost/material quality is eliminated. The process flow is simple and uses only one mask to define the seed holes. No additional masking step is required. The sealing of the seed holes takes place using a self-aligned process.

A preferred embodiment has been described in detail hereinabove. It is to be understood that the scope of the invention also comprehends embodiments different from those described, yet within the scope of the claims. For example, while the substrate used is referred to as silicon, it could be any appropriate semiconductor material, such as GaAs or Ge. Similarly, the oxide can be any insulator, and the nitride can be any material, other than the semiconductor and insulator previously used, that can be deposited and etched to achieve the desired results.

Moreover, an alternative embodiment may be used which reduces the number of epitaxial growth steps from three to two. The alternative embodiment is similar to the preferred embodiment up to FIG. 2f. At this point, a thermal oxidation and subsequent selective isotropic nitride etch are performed. A subsequent anisotropic etch forms the silicon islands 44 on the buried oxide layers 34. The structure is similar to FIG. 2i, with the exception of the height of the silicon islands 44. The silicon islands 44 are shorter and recessed with respect to the top of the oxide 26 because the second SEG process was not done. The process continues by filling the areas to the sides of the silicon islands 44 with oxide 46 followed by a final SEG process to fill the remainder of the trenches and merge the silicon islands 44 to form an insulated epi layer 48.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor-on-insulator wafer comprising:
   a. trenches having essentially vertical walls and essentially horizontal bottoms in a substrate;
   b. a first insulator on a surface of said substrate and on said trench bottoms;
   c. a second insulator thinner than said first insulator on said trench walls; and
   d. a layer of semiconductor material on said surface and extending into said trenches, said layer being insulated from said substrate.

2. The wafer of claim 1, wherein said first insulator and said second insulator are of the same material.

3. The wafer of claim 1, wherein said first and second insulators are of oxide.

4. The wafer of claim 1, wherein said semiconductor material is silicon.

5. The wafer of claim 1, wherein said substrate is silicon.

* * * * *